United States Patent
Tan

Patent Number: 6,061,266
Date of Patent: May 9, 2000

[54] FERROELECTRIC RANDOM ACCESS MEMORY DEVICE INCLUDING ACTIVE READ/WRITE CIRCUIT

[75] Inventor: Charles M. C. Tan, Santa Clara, Calif.

[73] Assignee: Hewlett-Packard Company, Palo Alto, Calif.

[21] Appl. No.: 09/335,241

[22] Filed: Jun. 17, 1999

[51] Int. Cl.[7] .................................................. G11C 11/22
[52] U.S. Cl. ...................... 365/145; 365/189.05; 365/205
[58] Field of Search .................................. 365/145, 149, 365/189.02, 189.05, 205

[56] References Cited

U.S. PATENT DOCUMENTS

| | | | |
|---|---|---|---|
| 5,262,982 | 11/1993 | Brassington et al. | 365/145 |
| 5,270,967 | 12/1993 | Moazzami et al. | 365/145 |
| 5,406,510 | 4/1995 | Mihara et al. | 365/145 |
| 5,835,399 | 11/1998 | Jeon | 365/145 |

*Primary Examiner*—Son Mai

[57] ABSTRACT

A ferroelectric random access memory device ("FeRAM") includes an array of memory cells and a plurality of active read/write circuits for reading the memory cells. A memory cell is read by forcing its ferroelectric capacitor to a first polarization state and determining whether capacitor discharge exceeds a threshold. If the capacitor transitions from a second polarization state to the first polarization state, the capacitor discharge will exceed the threshold. If the threshold is exceeded, a logic value corresponding to the second polarization state is indicated, and the ferroelectric capacitor is restored to the second polarization state. If the ferroelectric capacitor does not transition from the first polarization state to the second polarization state (i.e., the capacitor remains in the first polarization state), capacitor discharge will not exceed the threshold. If the threshold is not exceeded, a logic value corresponding to the first polarization state is indicated.

20 Claims, 7 Drawing Sheets

FIGURE 5a
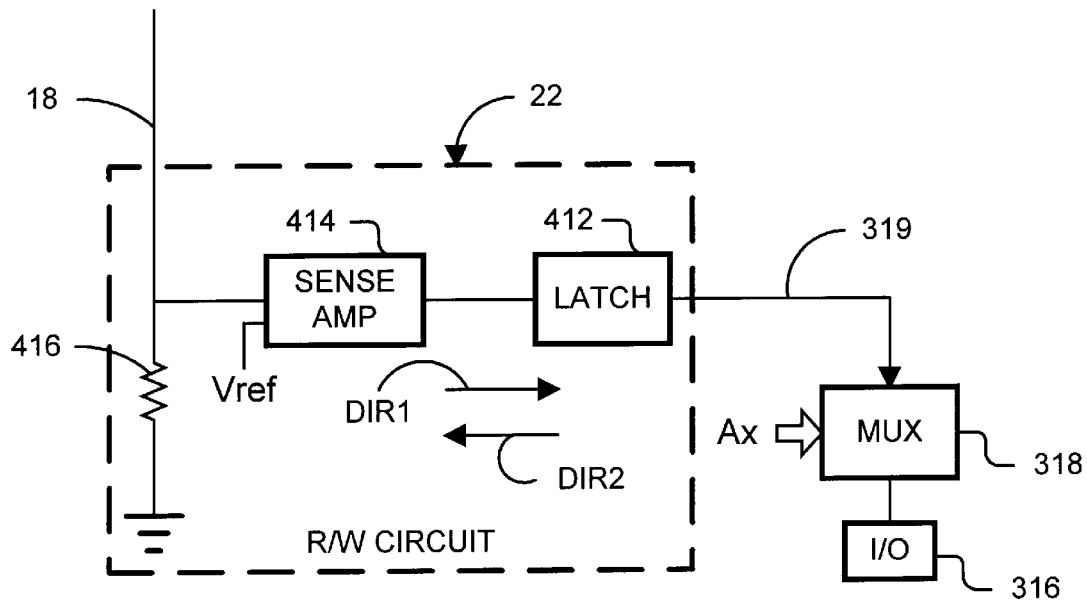
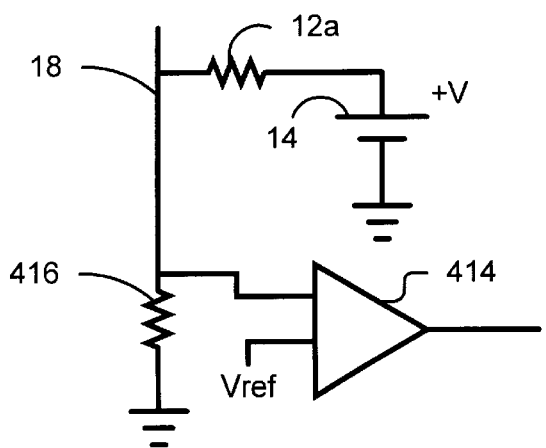
FIGURE 5b

FIGURE 7a
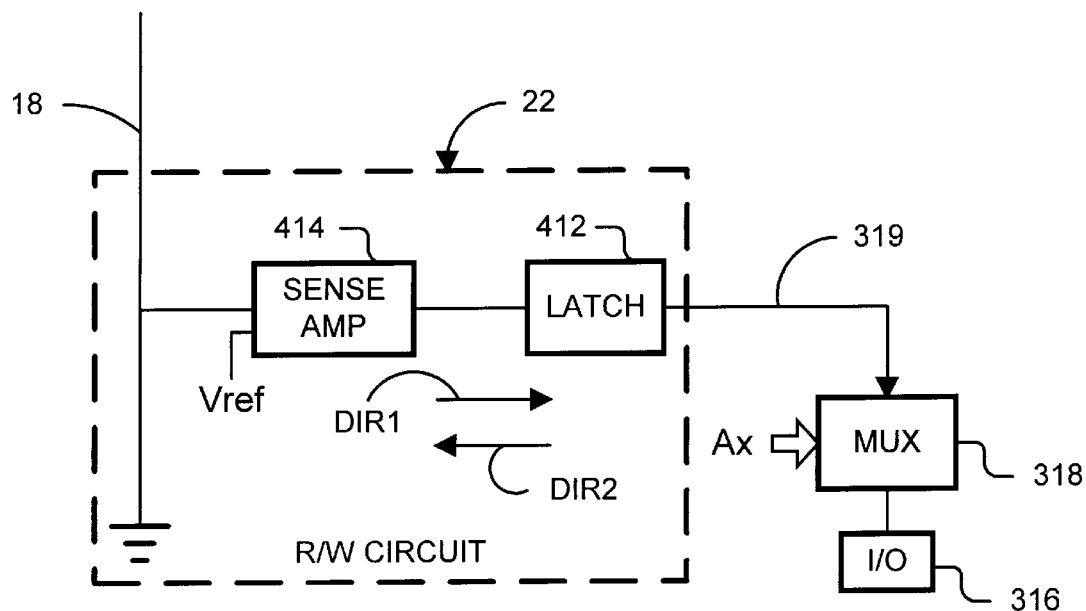
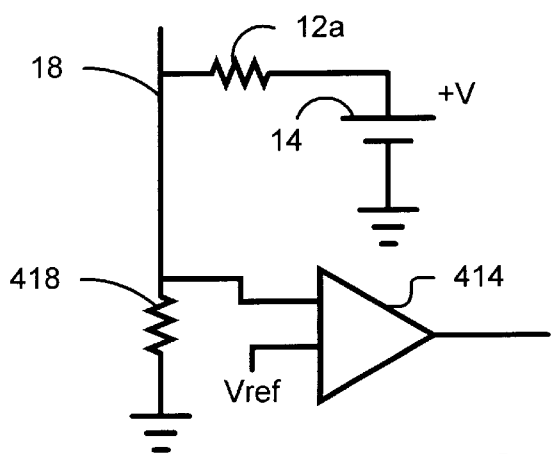
FIGURE 7b

FERROELECTRIC RANDOM ACCESS MEMORY DEVICE INCLUDING ACTIVE READ/WRITE CIRCUIT

BACKGROUND OF THE INVENTION

The invention relates to random access memory. More specifically, the invention relates to non-volatile ferroelectric random access memory.

Desirable characteristics of computer random access memory include high storage density, low cost, high speed, low power and non-volatility. Dynamic random access memory ("DRAM") memory is small, inexpensive, fast, and expends little power, but it is volatile and has to be refreshed many times each second. Flash memory is non-volatile, but it is larger than DRAM, slower than DRAM, more expensive, and expends more power than DRAM.

Ferroelectric random access memory ("FeRAM") is a type of non-volatile memory that is presently being considered for use in computers. An FeRAM device includes an array of memory cells. A typical memory cell includes a single ferroelectric capacitor and a single access transistor. The ferroelectric capacitor has two stable polarization states, which correspond to binary values. Additionally, the ferroelectric capacitor retains its state without electric power. Therefore, it is non-volatile.

In comparison to flash memory, FeRAM is less expensive and it operates at lower voltages. Additionally, FeRAM is much faster than flash memory. Whereas flash type EEPROM cells can take microseconds to write and milliseconds to erase, FeRAM devices can take nanoseconds to read and write. In fact, access times of FeRAM rival those of DRAM.

In comparison to DRAM devices, FeRAM devices are larger and more expensive. If FeRAM is to become competitive with established DRAM, especially for computer memory, cost of the FeRAM will have to be reduced.

The cost can be reduced by reducing the size of the FeRAM device, since memory cell density has a direct influence on chip cost. However, as the size of an FeRAM device is made smaller, leakage of the access transistors is increased. The leakage can create problems when reading the memory cells. A read circuit of a typical FeRAM device is based on a charge-sharing technique similar to that used in DRAM devices. The charge-sharing technique is used to determine the polarization of the capacitors and, therefore, determine the binary values stored in the memory cells. The applicant of the present invention has found that as the size of the access transistors is reduced below 0.2 microns, off-leakage of the access transistors will increase to a point where simple charge-sharing read operations cease to work properly.

In addition to increasing access transistor leakage, reducing the size of the device also results in lower supply voltages. Thus, the voltage that can be pumped into the ferroelectric capacitors is reduced and the ability of the ferroelectric capacitors to maintain a charge is diminished. Consequently, detecting the charge on the capacitors becomes more difficult.

There is also a different problem associated with FeRAM devices: fatigue of ferroelectric film used in the ferroelectric capacitors. Each time the polarization of a ferroelectric capacitor is reversed, the film undergoes fatigue. Polarization reversals may occur during read and write operations. After a certain number of reversals, the film looses polarization. Due to film fatigue, the permitted number of accesses with respect to the rewrite and read of the information is limited in comparison to random access memories such as DRAMs. If FeRAM devices are to become competitive with DRAM devices, the permitted number of access will have to be increased.

SUMMARY OF THE INVENTION

These different problems are overcome by a single solution: an active read operation. The active read operation forces polarization of the capacitor to a first polarization state; and detects a capacitor discharge. A first logic value is indicated if magnitude of the discharge exceeds a threshold, and a second logic value is indicated if magnitude of the discharge does not exceed the threshold. This operation works well with small, leaky transistors, and it reduces the number of polarization reversals. Therefore, the operation allows FeRAM devices to be made smaller and last longer.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 5a is an illustration of the active read circuit;

FIG. 5b is an illustration of an equivalent electrical circuit during a read operation by the active read circuit shown in FIG. 5a;

FIG. 7a is an illustration of an alternative active read circuit;

FIG. 7b is an illustration of an equivalent electrical circuit during a read operation by the active read circuit shown in FIG. 7a; and FIG. 8 is an illustration of a sense amplifier and latch for the active read circuits shown in FIGS. 5a and 7a.

DETAILED DESCRIPTION OF THE INVENTION

Figure 1:
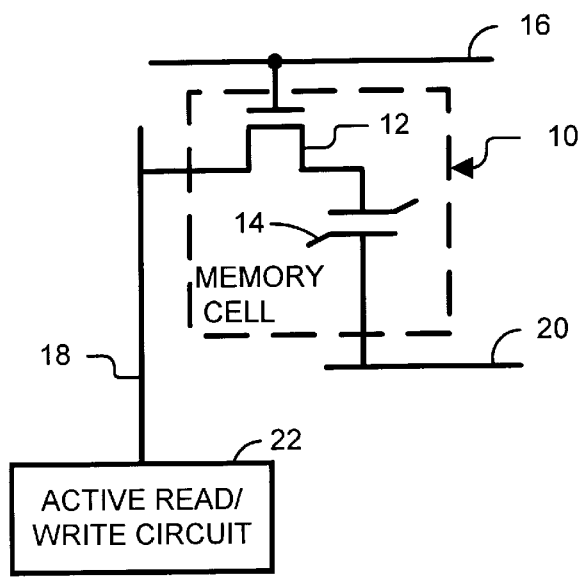
FIG. 1 is an illustration of an FeRAM device including a memory cell and an active read circuit.
Figure 6A:
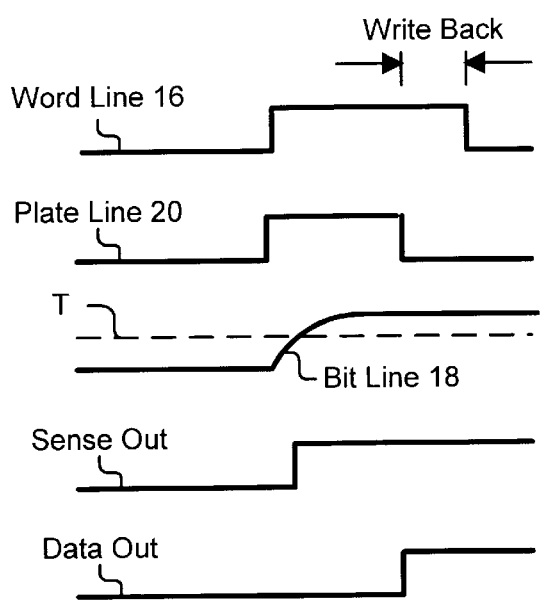
FIGS. 6a and 6b are timings diagram of a read operation.
Figure 6B:
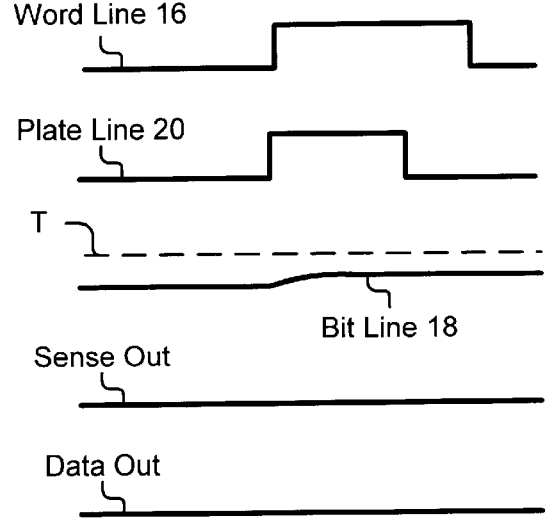

As shown in the drawings for purposes of illustration, the present invention is embodied in an FeRAM device. The FeRAM device includes an array of memory cells and an active read circuit for each column of the array. The active read circuits read polarization states of ferroelectric capacitors in the memory cells. The active read circuits work well with FeRAM devices having small, leaky access transistors and low operating voltages. Consequently, the access transistors of the FeRAM device can be made at sizes approaching those of DRAM devices. Additionally, the active read circuits reduce the number of polarization reversals in the capacitors. Consequently, operating life of the FeRAM device is increased.

FIG. 1 shows a memory cell 10 of an FeRAM device. The memory cell 10 includes an access transistor 12 and a ferroelectric capacitor 14. The capacitor 14 includes first and second plates that are separated by a thin film of ferroelectric material. The ferroelectric capacitor 14 has hysteresis, a curve of which is illustrated in FIGS. 2a to 2f (the abscissa indicates voltage applied to the ferroelectric capacitor 14 and the ordinate indicates polarization of the ferroelectric capacitor 14). If the polarization is positive, a sufficient negative voltage applied to the ferroelectric capacitor 14 will cause the polarization to become negative. Similarly, if the polarization is negative, a sufficient positive voltage applied to the ferroelectric capacitor 14 will cause the polarization to become positive.

The access transistor 12 has a gate connected to a word line 16 and a drain-source path connected between a bit line 18 and the first plate of the capacitor 14. The second plate of the ferroelectric capacitor 14 is connected to a plate line 20. The access transistor 12 functions as a switch for connecting the ferroelectric capacitor 14 to the bit line 18.

The bit line 18 and the plate line 20 are used in combination to apply positive and negative voltages to the ferroelectric capacitor 14. For instance, a first polarization state can be written to the ferroelectric capacitor 14 by turning on the access transistor 12, pulling the plate line 20 high and pulling the bit line 18 low. A second polarization state can be written to the ferroelectric capacitor 14 by turning on the access transistor 12, pulling the bit line 18 high and pulling the plate line 20 low.

An active read read/write circuit 22 performs a read operation to determine the polarization state of the capacitor 14 and thereby determine the binary value stored in the memory cell 10. The active read/write circuit 22 also performs a write operation to set the capacitor 14 to a desired polarization state and thereby store a binary value in the memory cell 10. The read operation is described in connection with FIG. 3a. The write operation is described in connection with FIG. 3b.

Figure 3A:
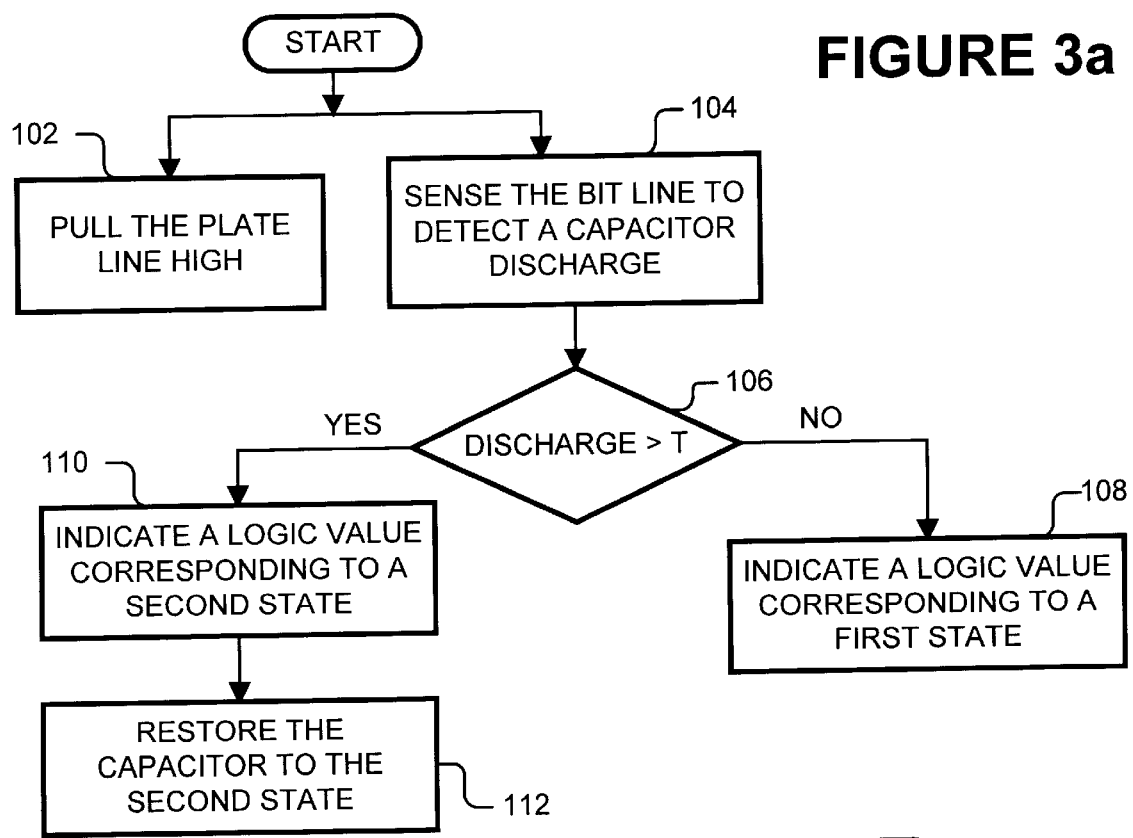
FIG. 3a is an illustration of a method of reading the polarization state of the ferroelectric capacitor during a read operation.

Reference is now made to FIG. 3a. At the start of the read operation, the plate line 20 is pulled high to an operating potential $V_{DD}$ (block 102) and, simultaneously, the access transistor 12 is turned on and the bit line 18 is sensed to detect a discharge of the ferroelectric capacitor 14 (block 104). If the capacitor 14 was at the second polarization state when the plate line 20 was pulled high, pulling the plate line 20 high would cause the ferroelectric capacitor 14 to transition to the first state. During this transition, the ferroelectric capacitor 14 would discharge.

If, however, the ferroelectric capacitor 14 was at the first state, pulling the plate line 20 high would not force the ferroelectric capacitor 14 to transition. The ferroelectric capacitor 14 would still discharge. However, the magnitude of the discharge would be smaller than the magnitude of the discharge occurring during the transition.

The magnitude of the discharge is compared to a threshold T (block 106). If the discharge magnitude does not exceed the threshold T, a logic value corresponding to the first state is indicated (block 108). If the discharge magnitude exceeds the threshold T, a logic value corresponding to the second state is indicated (block 110). Additionally, the capacitor 14 is restored to the second polarization state (block 112), since pulling the plate line 20 high forced the ferroelectric capacitor 14 to transition from the second polarization state to the first polarization state.

In this manner, the polarization of the capacitor 14 can be determined and the binary value stored in the memory cell 10 can be read. The read operation just described is "active" in that the plate line 20 is driven. The read operation is not passive, as is the case with charge-sharing techniques. Moreover, the read operation does not use a pre-charge circuit, which is commonly used in read operations based on charge-sharing techniques. Eliminating the pre-charge circuit reduces the number of components and increases access time of the FeRAM device. Resulting is a smaller, less expensive, faster FeRAM device.

Figure 3B:
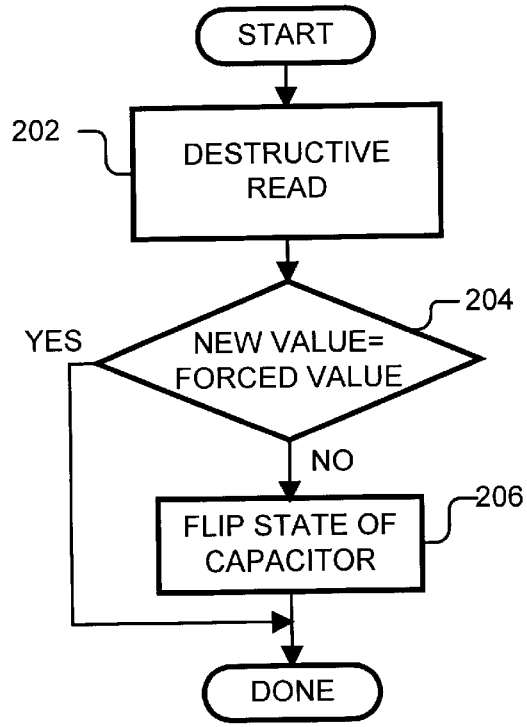
FIG. 3b is an illustration of a method of setting the polarization state of the ferroelectric capacitor during a write operation.

Reference is now made to FIG. 3b. A write operation on the memory cell 10 may be performed in two steps: (1) a destructive read of the memory cell 10, followed by (2) a selective write back to the memory cell (10). The destructive read is performed by reading the polarization states of the memory cell 10 while forcing the memory cell 10 to a known value (block 202). The destructive read may be performed by performing the steps of blocks 102 and 104.

The selective write back is then performed. If the new logic value is not the same as the forced value (block 204), the state of the memory cell 10 is flipped to the new value (block 206). If the new logic value is the same as the forced value (block 204), the logic value of the memory cell 10 is not flipped and remains the same. Thus, if the memory cell 10 was forced to a logic "1" during the destructive read, and the new value is a logic '0', the logic value of the memory cell 10 will be flipped from '1' to '0' during the write back. If the memory cell 10 was forced to a logic "1" during the destructive read, and the new value is a logic '1', the logic value of the memory cell 10 would not be flipped and would remain at '1'.

Figure 4:
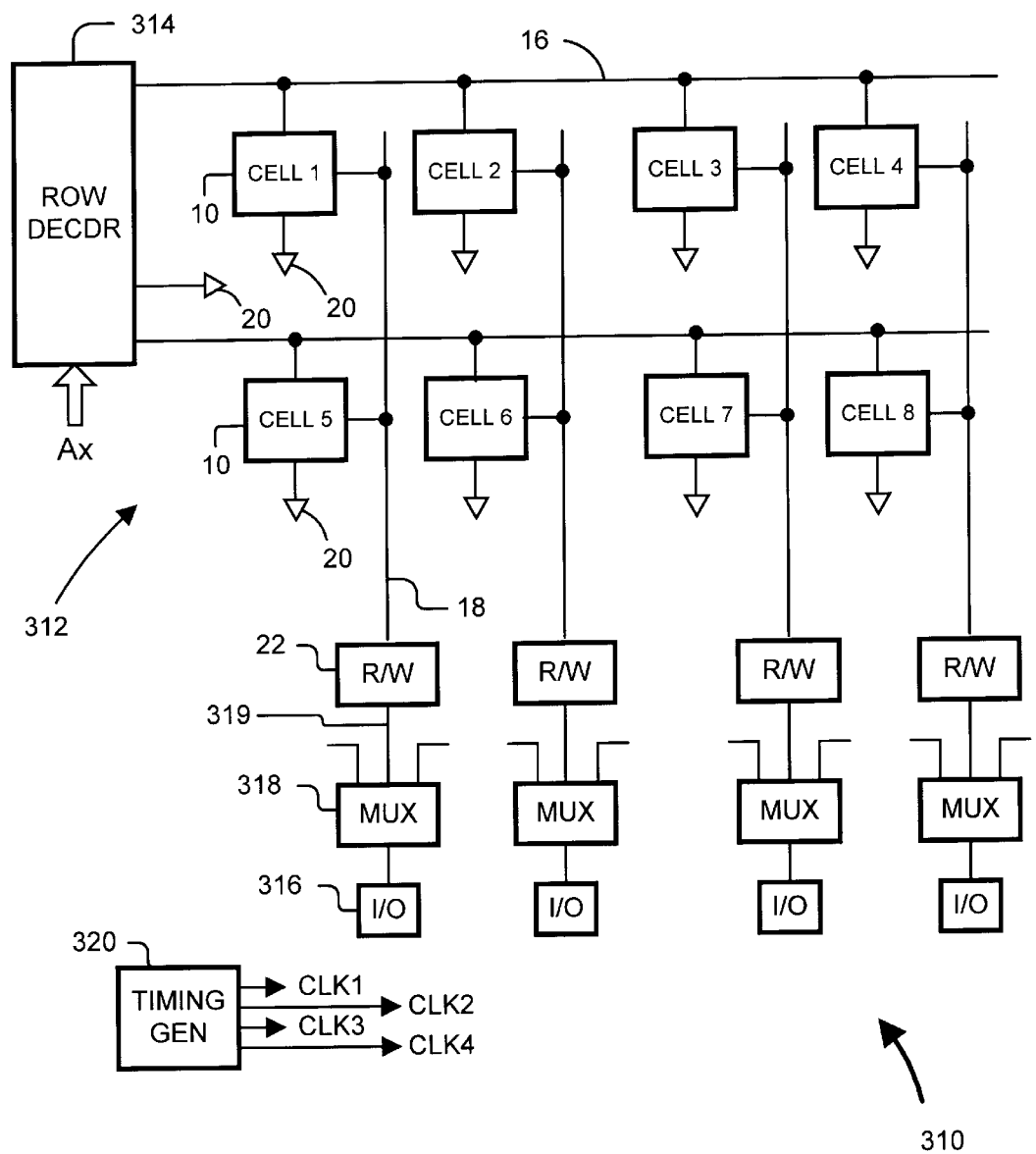
FIG. 4 is an FeRAM device including an array of memory cells and a plurality of active read circuits.

Reference is now made to FIG. 4, which shows an FeRAM device 310 including an mxn array 312 of memory cells 10, where m is an integer denoting the number of rows and n is an integer denoting the number of columns. The FeRAM device 310 further includes a number m of word lines 16, a number n of bit lines 18 and a common plate line 20. A word line 16 is provided for each row, and a bit line 18 is provided for each column. Each row of memory cells 10 is connected to a corresponding word line 16, and each column of memory cells 10 is connected to a corresponding bit line 18. Each memory cell 10 of the array 312 is also connected to the common plate line 20.

A row decoder 314 selects the word lines 16 in response to an address Ax. The row decoder 314 also drives the plate line 20 to either the operating potential $V_{DD}$ or to ground.

An active read/write circuit 22 may be provided for each column. Each read/write circuit 22 is coupled to a data multiplexer 318 via an I/O line 319. Each data multiplexer 318, in turn, is coupled to an I/O pad 316. Thus, the active read/write circuits 22 are multiplexed to I/O pads 316 of the FeRAM device 210, and the I/O pads 316 are demultiplexed to multiple read/write circuits 22. The data multiplexers 318 make their selections in response to the address Ax. The timing signals for the read/write circuits 22 will be discussed below.

The FeRAM device 310 further includes a timing generator 320. The timing generator 320 provides clock signals to the various components of the FeRAM device 310, including the read/write circuits 22.

FIG. 5a shows the active read/write circuit 22 in greater detail. The active read/write circuit 22 includes a bi-directional latch 412, a bi-directional sense amplifier 414 and a sense resistor 416. The latch 412 and sense amplifier 414 are bidirectional in that they can allow a signal to flow in a first direction DIR1 (from the sense amplifier 414 towards the latch 412) during a read operation and a second direction DIR2 (from the latch 412 towards the sense amplifier 414) during a write operation. The sense resistor 416 is connected between the bit line 18 and ground.

During a write operation, data is supplied to the latch 412 via the I/O pad 316 and the multiplexer 318. Depending upon the value stored in the latch 412, the sense amplifier 414 pulls the bit line 18 high or low.

During a read operation, the sense amplifier 414 senses a voltage drop across the sense resistor 416 and compares the sensed voltage drop to a threshold Vref. An equivalent circuit is shown in FIG. 5b, with the ON-resistance of the access transistors drain-source path being represented by a resistor 12a. When the capacitor 14 transitions from one polarization state to the other polarization state, its discharge causes the voltage drop to exceed the threshold Vref. The voltage drop does not exceed the threshold Vref if the capacitor 14 does not transition from one polarization state to the other polarization state. An output of the sense amplifier 414 is stored in the latch 412 and thereafter multiplexed to the I/O pad 316.

The sense resistor 416 may be constructed from polysilicon or metal. One possible construction of the latch 412 and the sense amplifier 414 is described below in connection with FIG. 8.

Figure 2A:
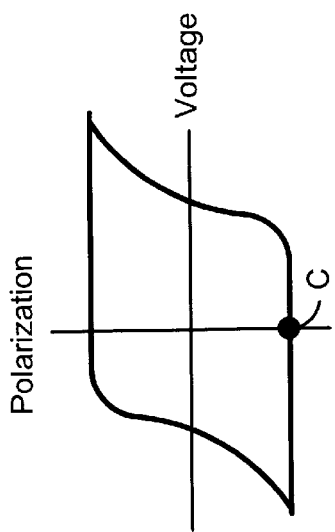
FIGS. 2a to 2f are illustrations of a hysteresis curve of a ferroelectric capacitor of the memory cell.
Figure 2B:
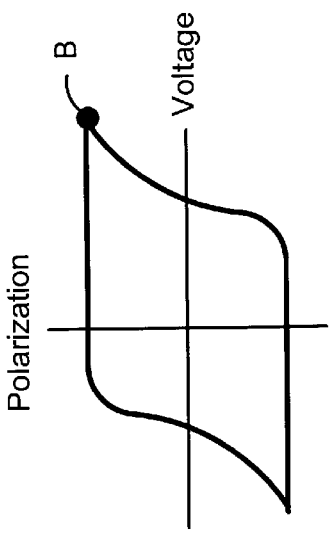
Figure 2C:
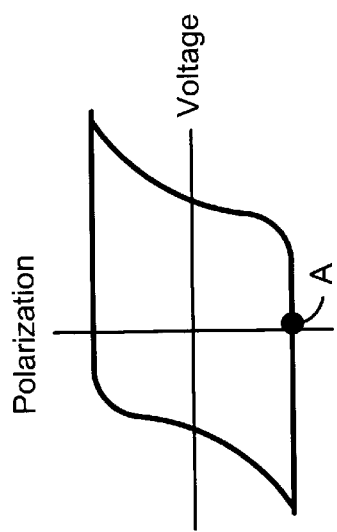

Referring additionally to FIGS. 2a to 2f and FIGS. 6a to 6b, read and write operations will now be described. Assume that the polarization of the capacitor 14 is in the second state at the beginning of a read operation. Position along the hysteresis curve of FIG. 2a is indicated by letter A. At the beginning of the read operation, the row decoder 314 decodes the address Ax and asserts a selected word line 16. All access transistors 12 connected to the selected word line 16 are turned on. The row decoder 314 also pulls the plate line 20 high. The sense amplifier 414 drives the bit line 18 low, whereby the polarization of the capacitor 14 is forced to the first state. The new position along the hysteresis curve is indicated by letter B in FIG. 2b.

Since the polarization of the capacitor 14 was forced from the second state to the first state, the capacitor 14 begins to discharge. The discharge causes the voltage on the bit line 18 to rise. The sense amplifier 414 senses the voltage drop across the sense resistor 416. When the voltage drop exceeds the threshold Vref, the output of the sense amplifier 414 goes high. This, in turn, causes a logic value '0' to be stored in the latch 412.

After the logic value '0' is stored in the latch 412, the word line 16 remains asserted, but the plate line 20 is pulled low. The latch 412 causes the sense amplifier 414 to drive the bit line 18 high. With the bit line 18 being driven high and the plate line 20 being driven low, the polarization of the capacitor 14 is restored or "written back" to the second state, whereby the position along the hysteresis curve is forced to position C in FIG. 2c.

The value stored in the latch 412 is multiplexed to the I/O pad 316. Thus, a bit of data is read out to the I/O pad 316.

Figure 2D:
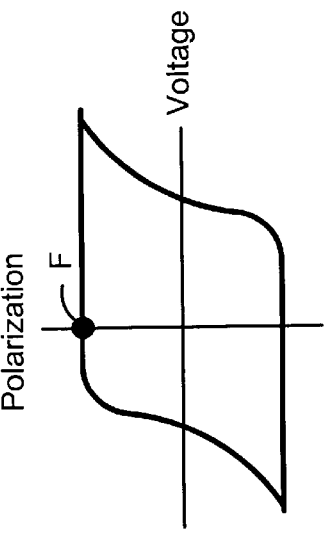
Figure 2E:
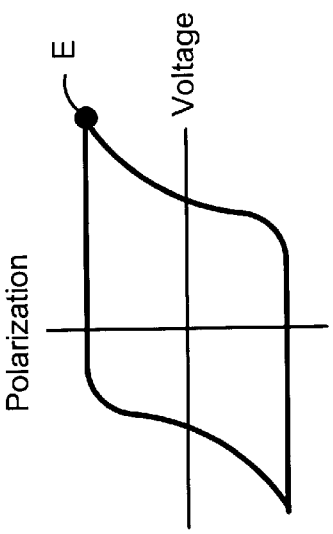
Figure 2F:
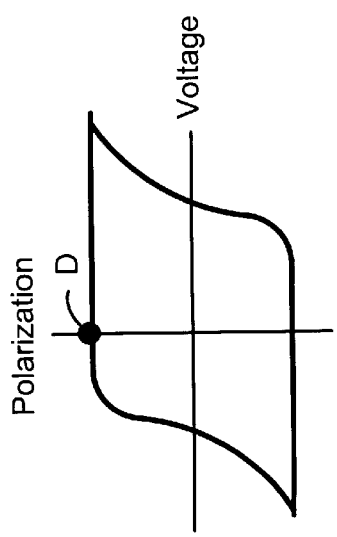

Assume instead that the polarization of the ferroelectric capacitor 14 is in the first state at the beginning of the read operation. Position on the hysteresis curve in FIG. 2d is indicated by letter D. At the beginning of the read operation the access transistor 12 is turned on, the plate line 20 is pulled high and the bit line 18 is pulled low. Position along the hysteresis curve is thus forced to position E in FIG. 2e. Thus, the polarization of the ferroelectric capacitor 14 remains at the first state.

Since no transition occurs, the voltage drop across the sense resistor 416 does not exceed the threshold Vref. As a result, the output of the sense amplifier 414 remains low, and a logic value '1' is written into the latch 412. Moreover, after the plate line 20 is pulled low (that is, during write back), the latch 412 causes the second amplifier 416 to hold the bit line 18 low. Therefore, the polarization of the ferroelectric capacitor 14 remains at the first polarization state, even though the position along the hysteresis curve return to position D.

At the beginning of a write operation, the row decoder 314 is commanded to assert the word line 16 of a selected memory cell 10 and pull the plate line 20 high. The sense amplifier 416 is commanded to pull the bit line 18 of the selected memory cell 10 low (for example, by writing a logic value '1' to the latch 412). Thus, the polarization of the selected memory cell's capacitor is forced to the first state (logic value '0'). Then the plate line 20 is pulled low and a bit of data is multiplexed from the I/O pad 316 to the latch 412. If the value stored in the latch 412 is a logic value '1', the sense amplifier 414 pulls the bit line 18 high, whereby polarization of the capacitor is forced to second state. If the value stored in the latch 412 is a logic value '0'2, the sense amplifier 414 pulls the bit line 18 low, whereby polarization of the capacitor 14 remains in the first state.

FIG. 7a shows an alternative active read/write circuit 510. This alternative circuit 510 does not include a sense resistor and, instead, relies upon the leakiness (OFF-resistance) of the access transistors 12. Each column of the array 312 includes many leaky transistors having their drain-source paths connected in parallel. When a capacitor 14 of a selected memory cell 10 discharges, current flows through the drain-source paths of the leaky transistors. The leakier the transistors, the lower the resistance of the drain-source path. The discharge is detected by sensing a voltage drop across the drain-source paths of the unselected access transistors. The equivalent circuit is illustrated in FIG. 7b, with the resistor 418 representing the OFF-resistance of the unselected transistors.

Leakier transistors make it easier to detect the discharge. Thus, instead of trying to eliminate leaky transistors, the present invention embraces leaky transistors and uses them advantageously to read the polarization states of the ferroelectric capacitors 14.

Figure 8:
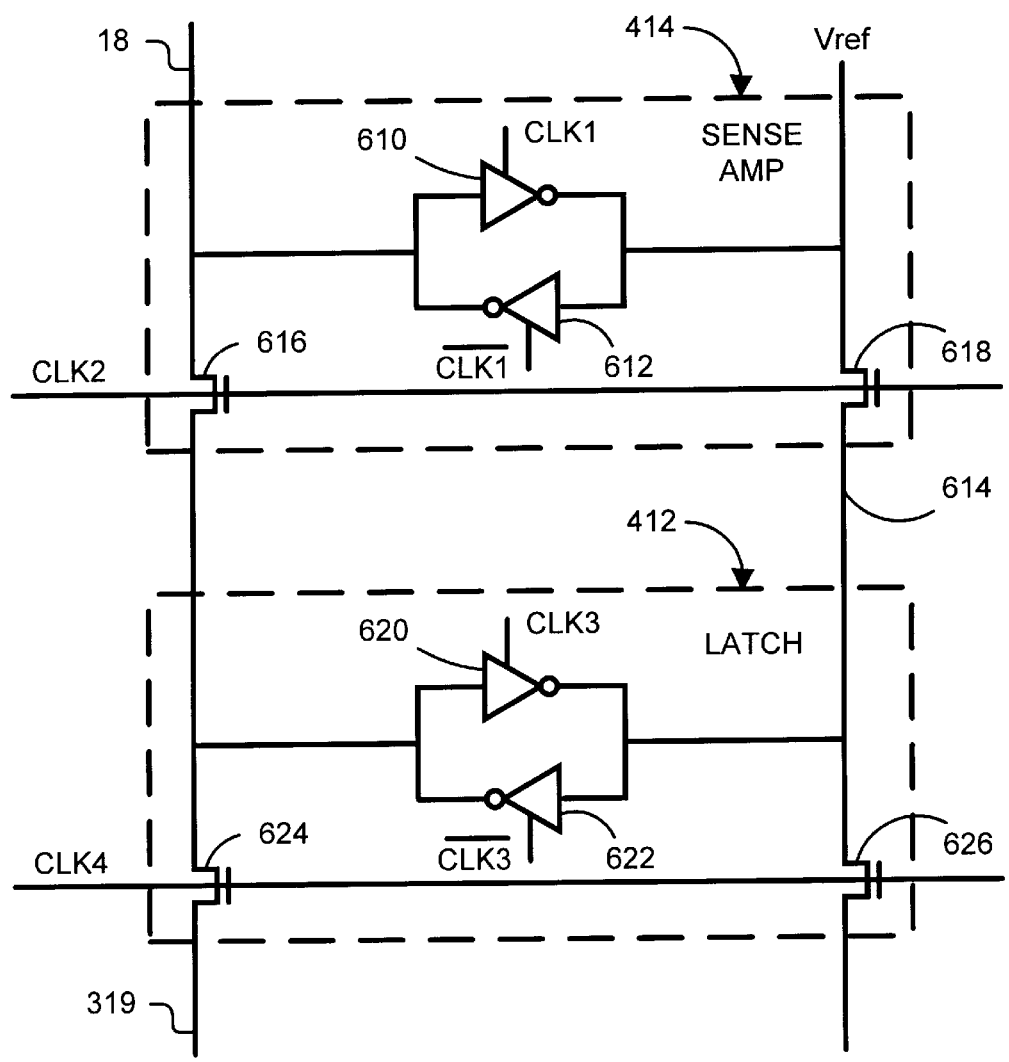

FIG. 8 illustrates one possible construction of the latch 412 and sense amplifier 414. The sense amplifier 414 includes a pair of cross-latched inverters 610 and 612 coupled between the bit line 18 and a reference voltage line 614 (which supplies the threshold Vref). Clock signals CLK1 and $\overline{CLK1}$ are supplied to the latches 610 and 612, respectively. A clock signal CLK 2 is used to switch on and off a first pair of transistors 616 and 618.

The latch 412 also includes a pair of cross-latched inverters 620 and 622 coupled between the I/O line 319 and the reference voltage line 614. Clock signals CLK3 and $\overline{CLK3}$ are supplied to the latches 620 and 622, respectively. A clock signal CLK4 is used to switch on and off a second pair of transistors 624 and 626.

The clock signals CLK1, CLK2, CL3 and CLK4 are generated by the timing generator 320 (shown in FIG. 4).

During a write operation, the clock signals are provided in the following sequence: CLK4-CLK3-CLK2-CLK1. This sequence causes data on the I/O pad 316 to be stored in the latch 412, then the data stored in the latch 412 to be amplified by the sense amplifier 414, and then an output of the sense amplifier 414 to drive the bit line 18 high or low.

During a read operation, the clock signals are provided in the following sequence: CLK1-CLK2-CLK3-CLK4. This sequence causes the sense amplifier 414 to compare the voltage drop to the threshold Vref, store the results of the comparison in the latch 412, and output the contents of the latch 412 to I/O pad 316 (via the multiplexer 318). The write back is performed by supplying the additional sequence of CLK2-CLK1.

Thus disclosed is an FeRAM device including an active read/write circuit that overcomes the problems associated with circuits based on charge-sharing techniques. The active read/write circuit can read memory cells having leakier transistors and lower operating voltages than can circuits based on charge-sharing techniques. Additionally, the active read/write circuit eliminates the need for pre-charge circuits, which are included in the read circuits of conventional DRAM devices and conventional FeRAM devices. Eliminating the pre-charge circuits reduces the number of components and increases access time. Resulting is a smaller, less expensive, faster FeRAM device.

The active read/write circuit also increases the endurance of the ferroelectric film. If the memory cell is in the first state, a polarization reversal does not occur during the read operation. Therefore, the number of polarity reversals are reduced during read operations. Consequently, operational life of the FeRAM device is extended.

The invention is not limited to the specific embodiments described and illustrated above. Instead, the invention is construed according to the claims that follow.

What is claimed is:

1. A method of reading a memory cell of a ferroelectric random access memory device, the memory cell including a ferroelectric capacitor, the method comprising:

forcing polarization of the capacitor to a first polarization state;

detecting a discharge of the capacitor;

indicating a first logic value if the capacitor discharge exceeds a threshold; and indicating a second logic value if the capacitor discharge does not exceed the threshold.

2. The method of claim 1, a plurality of unselected access transistors being coupled in parallel to the memory cell, wherein the discharge is detected by detecting a voltage drop across drain-source paths of the unselected access transistors.

3. The method of claim 1, wherein the capacitor discharges if it is forced to transition from a second polarization state to the first polarization state, and wherein the method further comprises restoring the capacitor polarization to the second state after the threshold has been exceeded.

4. The method of claim 1, wherein the capacitor discharges if it is forced to transition from a second polarization state to the first polarization state, wherein the logic value is indicated by writing to a latch, and wherein the method further comprises using the latch to restore the polarization of the capacitor to the second state after the threshold has been exceeded.

5. A ferroelectric random access memory device comprising:

a bit line and a plate line;

a memory cell including a ferroelectric capacitor coupled between the plate line and the bit line; and means, coupled to the bit line, for reading the memory cell by forcing polarization of the capacitor to a first polarization state; detecting a discharge of the capacitor; indicating a first logic value if the capacitor discharge exceeds a threshold; and indicating a second logic value if the capacitor discharge does not exceed the threshold.

6. An active read/write circuit for an FeRAM device, the device including a bit line, an I/O line, a multiplexer coupled to the IO line and an I/O pad coupled to the multiplexer, the active read circuit comprising:

a bidirectional sense amplifier having first and second I/O terminals, the first I/O terminal being coupled to the bit line;

a bi-directional latch having a first I/O terminal coupled to the second I/O terminal of the sense amplifier, the latch having a second I/O terminal coupled to the I/O line.

7. The circuit of claim 6, further comprising a resistor coupled between ground and the first terminal of the sense amplifier, whereby the sense amplifier detects a capacitor discharge by detecting a voltage drop across the resistor.

8. The circuit of claim 6, wherein the FeRAM device includes a plurality of access transistors coupled to the bit line, and wherein the sense amplifier detects a capacitor discharge by detecting a voltage drop across the access transistors coupled to the bit line.

9. The circuit of claim 6, further comprising a timing generator for activating the sense amplifier and then activating the latch during a read operation.

10. The circuit of claim 9, wherein the timing generator activates the sense amplifier once again after activating the latch to write back to the bit line.

11. The circuit of claim 6, further comprising a timing generator for activating the latch and then activating the sense amplifier during a write operation.

12. The circuit of claim 6, wherein the sense amplifier includes a first pair of cross-latched inverters connected between the bit line and a reference line, and wherein the latch includes a second pair of cross-latched inverters coupled between the I/O line and the reference line.

13. The circuit of claim 12, further comprising:

a first pair of transistors coupling the first pair of inverters to the I/O and reference lines;

a second pair of transistors coupling the second pair of inverters to the I/O and reference lines; and a clock generator for generating first, second, third and fourth clock signals, the clock generator supplying the first clock signal to the first pair of inverters, the second clock signal to the first pair of transistors, the third clock signal to the second pair of inverters and the fourth clock signal to the second pair of transistors;

the generator supplying a first sequence of first, second, third and fourth clock signals during a read operation.

14. The circuit of claim 13, wherein the generator further provides a second sequence of second and first clock signals after supplying the first clock sequence, whereby a write back is performed when the second sequence is supplied.

15. The circuit of claim 12, further comprising:

a first pair of transistors coupling the first pair of inverters to the I/O and reference lines;

a second pair of transistors coupling the second pair of inverters to the I/O and reference lines; and a clock generator for generating first, second, third and fourth clock signals, the clock generator supplying the first clock signal to the first pair of inverters, the second clock signal to the first pair of transistors, the third clock signal to the second pair of inverters and the fourth clock signal to the second pair of transistors;

the generator supplying a sequence of fourth, third, second and first clock signals during a write operation.

16. An FeRAM device comprising:

an mxn array of memory cells, where positive integer m denotes a number of rows in the array and positive integer n denotes a number of columns in the array;

a plurality of bit lines, each bit line corresponding to a column of the array;

a plurality of read/write circuits, each read/write circuit corresponding to a bit line;

a plurality of I/O pads;

a plurality of multiplexers, each multiplexer coupling a corresponding I/O pad with a plurality of read/write circuits; and a timing generator;

each read/write circuit including a bi-directional sense amplifier and a bi-directional latch, each sense amplifier having a first I/O terminal coupled to a corresponding bit line and a second I/O terminal coupled to a first I/O terminal of the latch, the latch having a second I/O terminal coupled to a corresponding multiplexer;

the timing generator sequencing the sense amplifier and then the latch of a selected read/write circuit during a read operation;

the timing generator sequencing the latch and then the sense amplifier of a selected read/write circuit during a write operation.

17. The device of claim 16, wherein each sense amplifier detects a capacitor discharge by detecting a voltage drop across the access transistors coupled to the corresponding bit line.

18. The circuit of claim 16, wherein each read/write circuit further includes a resistor coupled between ground and the first I/O terminal of the sense amplifier, whereby the sense amplifier of a selected read/write circuit detects a voltage drop across the resistor.

19. The device of claim 16, wherein the timing generator further sequences the sense amplifier of a selected read/write circuit after sequencing the latch during the read operation.

20. The circuit of claim 16, wherein each sense amplifier includes a first pair of cross-latched inverters connected between the bit line and a reference line, and wherein each latch includes a second pair of cross-latched inverters coupled between the I/O line and the reference line.

* * * * *